United States Patent
Dawson et al.

[11] Patent Number: 5,968,843
[45] Date of Patent: Oct. 19, 1999

[54] METHOD OF PLANARIZING A SEMICONDUCTOR TOPOGRAPHY USING MULTIPLE POLISH PADS

[75] Inventors: Robert Dawson; H. Jim Fulford, Jr.; Fred N. Hause; Basab Bandyopadhyay; Mark W. Michael; William S. Brennan, all of Austin, Tex.

[73] Assignee: Advanced Micro Devices, Inc., Sunnyvale, Calif.

[21] Appl. No.: 08/768,278

[22] Filed: Dec. 18, 1996

[51] Int. Cl.⁶ .................................................. H01L 21/302
[52] U.S. Cl. ................................. 438/693; 216/38; 216/89
[58] Field of Search ................................ 216/38, 88, 89, 216/90, 91; 438/633, 692, 693

[56] References Cited

U.S. PATENT DOCUMENTS

| | | | |
|---|---|---|---|
| 4,481,741 | 11/1984 | Bouladon et al. | 51/131.1 |
| 5,084,419 | 1/1992 | Sakao | 437/228 |
| 5,234,868 | 8/1993 | Cote | 437/225 |
| 5,287,663 | 2/1994 | Pierce et al. | 51/401 |
| 5,302,233 | 4/1994 | Kim et al. | 156/636.1 |
| 5,362,669 | 11/1994 | Boyd et al. | 437/67 |
| 5,395,801 | 3/1995 | Doan et al. | 437/225 |
| 5,514,245 | 5/1996 | Doan et al. | 156/636.1 |
| 5,534,106 | 7/1996 | Cote et al. | 438/693 |
| 5,571,373 | 11/1996 | Krishna et al. | 438/693 |
| 5,618,381 | 4/1997 | Doan et al. | 438/633 |
| 5,665,202 | 9/1997 | Subramanian et al. | 438/692 |
| 5,704,987 | 1/1998 | Huynh et al. | 134/6 |

FOREIGN PATENT DOCUMENTS

| | | |
|---|---|---|
| 59-014469 | 1/1984 | Japan . |
| 7-142432 A2 | 6/1995 | Japan . |

OTHER PUBLICATIONS

Hayashi, Y. et al, "Al–CMP technique for ultra–fine pitched Al–interconnect formation in 0.1 micron–CMOS eru" Materia, 36 (6), abstract, 1997.

*Primary Examiner*—Bruce Breneman
*Assistant Examiner*—Anita Alanko
*Attorney, Agent, or Firm*—Kevin L. Daffer; Conley, Rose & Tayon

[57] ABSTRACT

An improved method for planarizing an interlevel dielectric comprising two chemical mechanical polish steps. After an interlevel dielectric containing a topographical valley between a pair of topographical peaks is formed, the dielectric is chemically-mechanically polished in a first polish step at a first force using a first polish pad having a first rigidity to round the sharp dielectric corners or edges that exist at the transition between the peaks and valleys. After the first polish step has rounded the edges, a second polish step is performed with a second polish pad of second rigidity. The second polish pad is more rigid than the first polish pad and the second force is greater than the first. The second polish steps uses a high viscosity slurry to reduce slurry turnover in the regions proximate to the dielectric valleys thereby reducing the chemical etching in the valleys and improving the planarization efficiency.

7 Claims, 9 Drawing Sheets

METHOD OF PLANARIZING A SEMICONDUCTOR TOPOGRAPHY USING MULTIPLE POLISH PADS

BACKGROUND OF THE INVENTION

1. Field of the Invention

This invention relates to the semiconductor processing and, more particularly, to a method for planarizing an interlevel dielectric using a two step chemical-mechanical polish (CMP).

2. Description of the Relevant Art

Semiconductor devices formed into semiconductor substrates are generally well known. The densities of semiconductor devices have steadily increased over the years. Operating speed has increased as a result of a reduction in geometries of individual semiconductor devices. As device geometries drop below 2.0 μm per side, however, the marginal benefit of further device geometry reductions is limited by the size of interconnect contacts. Accordingly, circuit designers are turning towards multiple level interconnects to increase the density of their devices. Semiconductor processes employing one and two levels of interconnect are now well known to those skilled in semiconductor manufacturing and process development. More recently, however, state-of-the-art processes are beginning to employ three, four and five levels of interconnect. As the number of vertical levels increases, the importance of adequately planarizing each interlevel dielectric (i.e., dielectric material placed between levels of interconnect) increases as well.

Planarization refers to the technique used for producing a substantially flat or "planar" topographical surface from a pre-existing non-planar surface. The degree of planarity varies with the planarization process chosen. Photolithography, etch, and deposition steps all require a surface which is as planar as possible. When vertical interconnect levels are added to a process, planarization steps must be incorporated in the process to ensure that each interlevel dielectric is as planar as possible, in readiness for the subsequent interconnect level.

There are many types of planarization processes. A popular reflow process is typically used in processes embodying less dense features. Reflow entails depositing, for example, a borophosphosilicate glass (BPSG). Thereafter, the BPSG is heated such that it reflows across the topography to form a more planar surface than the initial surface. BPSG reflow however became increasingly ineffective as device features became increasing smaller. Accordingly, BPSG has given way to some extent to etchback process. Etchback involves depositing a photoresist layer onto the surface of the semiconductor. Photoresist is typically spin-on deposited to achieve a substantially level resist surface. Thereafter, the photoresist and underlying dielectric is etched at typically the same etch rate to preserve the planar topography of the removed resist within the dielectric.

Chemical-mechanical polish is a relatively recent advance in planarization technology. CMP has proved successful in planarizing either a dielectric or metal surface. In a CMP process, a semiconductor wafer is held in a wafer carrier and placed in contact with a chemical-mechanical polish pad attached to a CMP platen. The platen rotates with respect to the wafer and a chemical-mechanical slurry is introduced onto the polish platen surface. In a typical CMP slurry used to polish dielectrics such as oxide, silica particles are combined in a basic solution to effect a combination chemical and mechanical etch. The solution essentially provides the chemical etch component of the CMP, while the silica particles contribute to the mechanical abrasion and removal component. An acidic slurry solution containing an alumina abrasive is commonly used to polish metals such as tungsten.

Non-planar semiconductor surfaces are comprised of elevational high spots (hereinafter "peaks") and elevational low spots (hereinafter "valleys"). A step occurs between a peak and a valley. The step height can be quite severe if the peak and valley elevational disparity is large. In many instances, interlevel dielectrics incur elevational disparities in the range between 0.1 to 1.5 μm during deposition. Accordingly, a need arises to remove those disparities, preferably using a CMP process. The effectiveness by which the disparities are reduced, if not removed, is referred to as a planarization factor. It is desirable that an elevational disparity of less than 0.01 μm be achieved globally across the entire topography to ensure optimal processing of subsequent layers.

Planarization factor is dependent upon, for example, polish pad composition, force applied to the wafer against the polish pad, and the composition of the slurry. A polish pad can be either rigid or soft, with varying degrees of rigidity in between. The dielectric is one defined as having peaks and valleys, wherein the distance between densely spaced peaks is less than 10.0 μm. and the distance between sparsely spaced peaks is greater than 10.0 μm.

Rigid polish pads are desirable because rigid pads tend not to conform to the topography of the underlying wafer surface. A rigid pad will demonstrate a propensity to etch the peaks at a greater rate than the valleys because the rigid pad will predominantly contact only the peaks, leaving the valleys intact. Because of their rigidity, however, the rigid pads tend to create wafer "chatter". Wafer chatter refers to the effect caused by a rigid pad's inability to conform to the wafer surface at the leading and trailing edges of wafer surface peaks. The leading and trailing edges are defined as the corners of the respective peaks measured in the direction taken by the spinning pad. The leading edge, therefore, is the peak edge facing the incoming pad surface, whereas the trailing edge is the edge facing the outgoing pad surface. Chatter is demonstrated as a on/off (or contact/separation) of the pad to the wafer surface. The on/off or bounce experienced by the pad surface upon the peaks tends to dislodge large pieces of leading or trailing edge regions from the dielectric. The large fracture material thereafter moves with the pad, possibly causing abrasion of valley areas, or extensive removal of peak areas, as well as mechanical damage or scratches to the layer begin polished.

To avoid the effects of wafer chatter, softer (or more flexible) polish pads are frequently employed. Soft polish pads tend to conform to the sharpness at the leading and trailing edges to not only maintain contact with those edges, but also to smooth those edges in readiness for subsequent processing. Accordingly, soft pads used in lieu of rigid pads avoid wafer chatter problems. As the force applied to the wafer increases, soft pads tend, unfortunately, to make greater physical contact with the valley areas. Any contact with the valleys between sparsely spaced peaks result in lessened global planarization. Unfortunately, soft pads have a greater tendency to conform to valleys between sparsely spaced peaks rather than between densely spaced peaks.

It is therefore important to control the rigidity of the pad applied to the wafer surface. Along with selecting the right pad, it is also important to select the proper slurry characteristics. Low viscosity (i.e., low solid concentration) slurries generally demonstrate a greater flow or transfer rate of silica particles across the wafer. Typically, a low viscosity slurry will allow silica to move from areas of high contact pressure to areas of low contact pressure. High contact pressure areas are found at the peaks; low contact pressure areas are found at the valleys. A low viscosity CMP slurry results in significant material turnover and exchange in peak areas to valley areas, possibly causing chemical attack in valleys absent mechanical contact. Any appreciable etching of the valleys severely limits the overall CMP planarization. Slurry pH is also important in setting the chemical to mechanical removal rate ratio with higher pH giving a higher chemical removal rate for oxides.

SUMMARY OF THE INVENTION

The problems outlined above are in large part solved by a two-step CMP process hereof. The CMP process involves application of two separate polish pads to a wafer topography. The first polish pad is defined as a non-rigid pad (i.e., a soft pad) applied in a normal direction upon the topography. After removal of the first polish pad, a second polish pad made of rigid matter is applied. The second (rigid) polish pad is applied at a force greater than the force at which the first pad is applied.

The soft polish pad is chosen to conform to the topographical surface which comprises significant elevational disparity between peaks and valleys which extend across the surface. After formation of, for example, a dielectric, and prior to the CMP process, the dielectric upper surface comprises a plurality of peaks and valleys. The topographical transition between adjacent peaks and valleys can be sudden such that sharp corners exist at the edges of the peaks. The soft polish pad applied first in the sequence has the advantage of conforming to the sharp corners. If carried out at a sufficiently low force, the first polish will tend to conform to the sharp corners at the transition between the peaks and valleys and thereby smooth those corners for subsequent processing. A low force is employed during application of the soft pad polish since it is necessary to avoid substantial deformation of the pad. If a high force is applied to the soft polish pad, the soft polish pad will deform to the topographical valleys and thereby remove dielectric from those valleys.

Applying the soft polish pad to the wafer at a low force rounds the edges of the topographical peaks without polishing the topographical valleys. The rounded edges are less prone to cause wafer chatter during a subsequent polish step performed with a rigid pad. Chatter is caused by a polish pad's inability to conform to the wafer topography and varies, accordingly, with the rigidity of the pad and the severity of the topography. (A severe topography being defined as a topography having steep, sudden transitions between topographical peaks and topographical valleys.) Wafer chatter can dislodge fragments from the wafer topography that can combine with the slurry and undesirably augment the mechanical polish. In addition, the dielectric topography in the region from where the fragments originated can have undesirably jagged edges. Applying the soft polish pad to the wafer topography at low force minimizes the wafer chatter produced during a subsequent rigid pad polish by rounding the edges at the topographical peaks and thereby lessening the severity of the topography.

After the wafer topography has been polished with the first polish pad, the first polish pad is removed and replaced with a second polish pad that is more rigid than the first polish pad. (Alternatively, a 2 pad machine may be used.) The rigidity of the second polish pad prevents it from substantially conforming to the wafer topography. The second polish pad is then applied to the wafer topography at a second force. The second force is sufficient to effect a mechanical polish in the areas where the rigid pad contacts the wafer topography. The rigidity of the second pad is chosen such that the pad deforms an amount substantially less than the elevational distance between the peaks and the valleys when the second force is applied. During application of the rigid pad to the wafer topography, the rigid pad will be substantially in contact with the topographical peaks while there will remain a separation distance between the rigid pad and the topographical valleys. In this manner, the rigid pad will contact the wafer peaks at a force sufficient to achieve a mechanical polish of the peaks without contacting and, therefore, without mechanically polishing the topographical valleys. By maximizing the mechanical polish occurring at the peaks while minimizing the mechanical polish in the valleys, the rigid pad polish step achieves a high planarization factor.

To further improve the planarization factor, a high viscosity slurry is used during the rigid pad polish step. CMP slurries affect planarization by chemically polishing the wafer topography. To sustain the chemical component of a CMP process, it is necessary to continuously replenish the slurry. If the slurry is not replenished, the active chemicals within the slurry are consumed by the chemical reaction that comprises the chemical component of the polish and the chemical component of the polish diminishes.

The rate at which the slurry is replenished, referred to as the slurry turnover rate, varies with the slurry pressure and inversely with the slurry viscosity. When a rigid pad coated with a layer of CMP slurry is applied to a wafer surface, a pressure gradient results in the slurry. In the vicinity of the topographical peaks, slurry pressure is high due to the physical proximity of rigid pad to the wafer topography. Conversely, slurry pressure is low in the topographical valleys, where a separation distance exists between the rigid pad and the wafer topography. The viscosity of the slurry is chosen to minimize the turnover rate in the low pressure regions (i.e. the valleys) while maintaining a turnover rate in the high pressure regions sufficient to sustain an acceptable chemical polish. The chemical component of the rigid pad polish step is thereby minimized near the topographical valleys and maximized near the topographical peaks thereby additionally improving the planarization factor.

Broadly speaking, an improved process hereof comprises a first step of providing a dielectric surface that has a topographical valley placed between a pair of topographical peaks. After the dielectric surface has been provided, a first polish is performed using a first polish pad that has a first rigidity. The first polish is followed by a second polish pad which is accomplished using a second polish pad of a second rigidity. A rigidity of the second polish pad is greater than the rigidity of the first polish pad.

The present invention further contemplates a method for planarizing an interlevel dielectric comprising a dielectric surface having a valley region placed between a pair of peaks. The dielectric surface is formed such that the upper surface of the valley region is lower than the upper surface of pair of peaks. A first polish pad having a first rigidity is applied to the dielectric surface at a first force. The first polish pad deforms about the peaks at a first spaced distance from valley region. After applying the first polish pad to the dielectric, the first polish pad is removed from the dielectric and a second polish pad having a second rigidity is applied to dielectric surface at a second force. The second polish pad deforms about the pair of peaks a second spaced distance which is greater than the first spaced distance from the valley region. The present invention further contemplates a planarized dielectric surface formed by the method just described wherein the planarized dielectric surface has a pair of edges surrounding each pair of peaks. The pair of edges being rounded as a result of applying the first polish pad.

The present invention still further contemplates a planarized dielectric surface formed by the method described previously wherein the dielectric surface has a pair of peaks and a valley interposed between the peaks. The peaks and valley are planarized as a result of the two-step CMP process to substantially the same elevational level.

BRIEF DESCRIPTION OF THE DRAWINGS

Other objects and advantages of the invention will become apparent upon reading the following detailed description and upon reference to the accompanying drawings in which.

Figure 1:
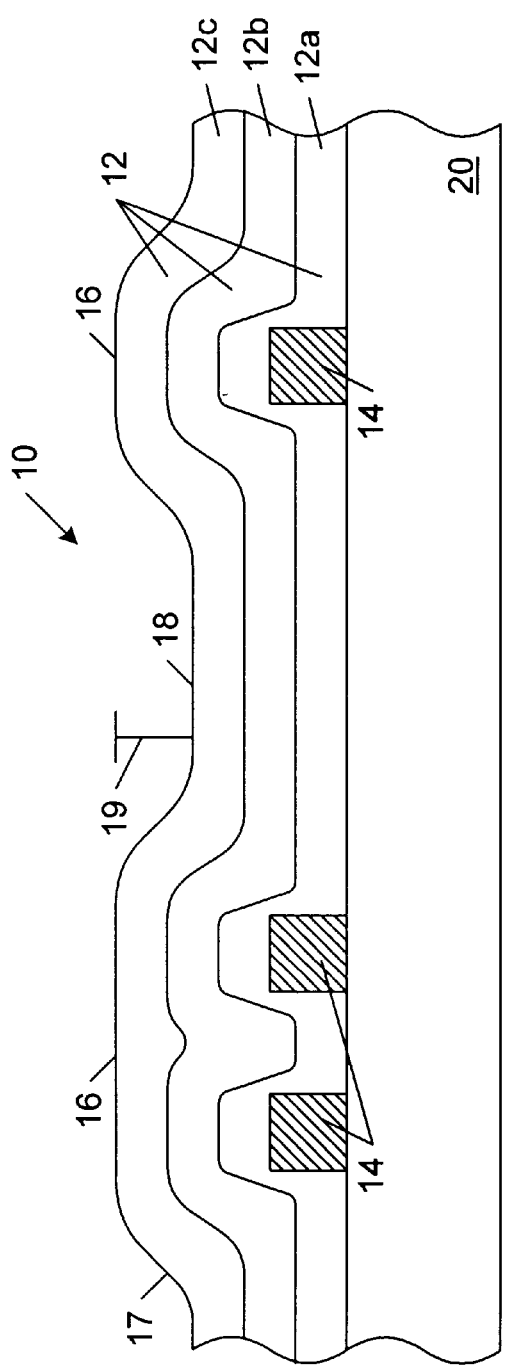
FIG. 1 is a partial cross-sectional view of a semiconductor wafer immediately after formation of a non-planar multi-layered dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE DRAWINGS

Turning now to FIG. 1, semiconductor wafer 10 is shown in cross-section after formation of an inter-level dielectric 12 upon substrate 20. As seen in the drawing, dielectric 12 comprises elevational peaks 16 and elevational valleys 18. In one embodiment, dielectric 12 is composed of multiple dielectric layers 12a, 12b, and 12c. Preferably, dielectric 12a is an oxide formed in a low pressure chemical vapor deposition (LPCVD) reactor from a silane or TEOS source such that dielectric 12a conforms to the topography of the underlying conductive elements 14. Although disclosed as conductive elements in this drawing, topography elements 14 can be comprised of insulators as well. On top of conformal oxide 12a, a flowable oxide such as spin-on glass (SOG) or a TEOS oxide is used to achieve local planarization in areas of dense circuitry. In the embodiment shown, dielectric layer 12c is deposited on top of layer 12b to provide a moisture impervious cap. Dielectric 12c is preferably $SiO_2$ deposited in a chemical vapor deposition reactor.

Figure 2:
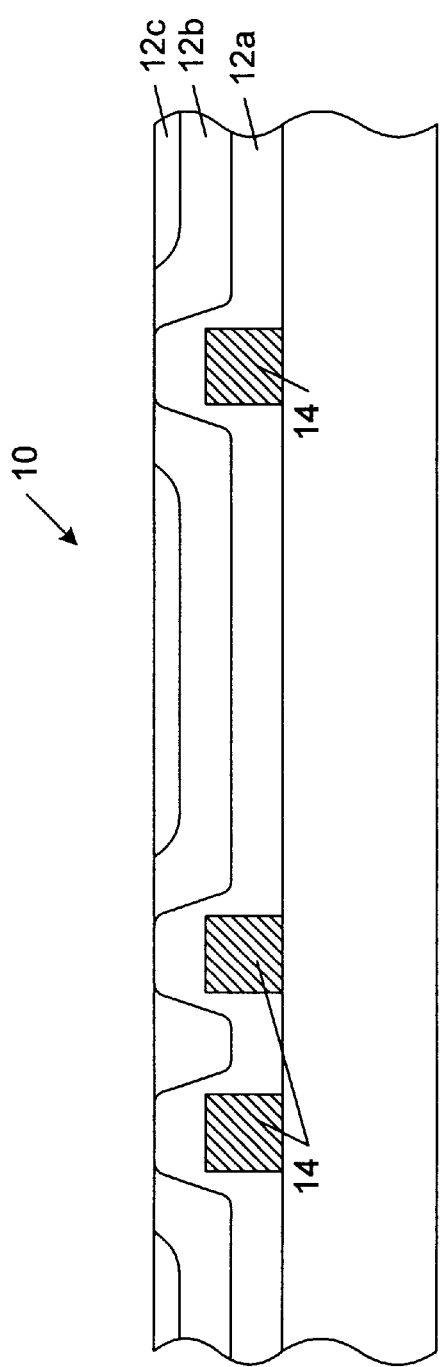
FIG. 2 is the wafer of FIG. 1 after an idealized planarization process.

FIG. 2 shows a cross-section of the wafer of FIG. 1 after an idealized planarization process in which none of oxide 12 is removed from valleys 18 while the topographical peaks 16 are eliminated.

Figure 3:
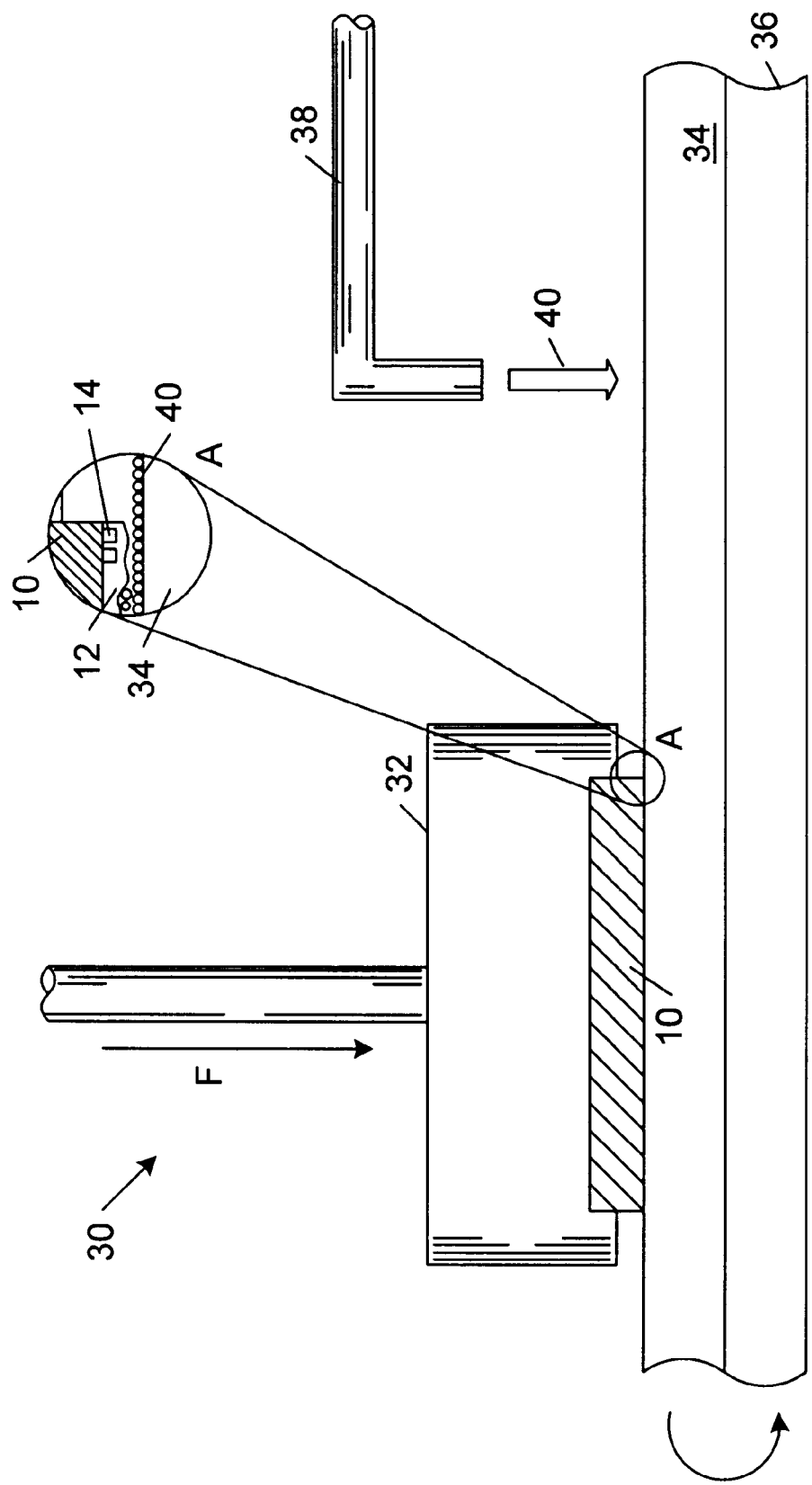
FIG. 3 is an elevational view of a chemical-mechanical polisher.

FIG. 3 is a elevational view of chemical-mechanical polisher 30. Polisher 30 is comprised of wafer carrier 32, polishing pad 34, which is removably attached to polish platen 36. Polisher 30 is adapted to receive a slurry 40 through a delivery device 38. Wafer carrier 32 is adapted to receive wafer 10 such that dielectric layer 12 is in close proximity to slurry 40 upon wafer polish pad 34. Wafer carrier 32 is adapted to rotate with respect to polishing platen 36. Polisher 30 also controls force F that is applied to wafer 10 as it is pressed into contact with polishing pad 34.

Figure 4:
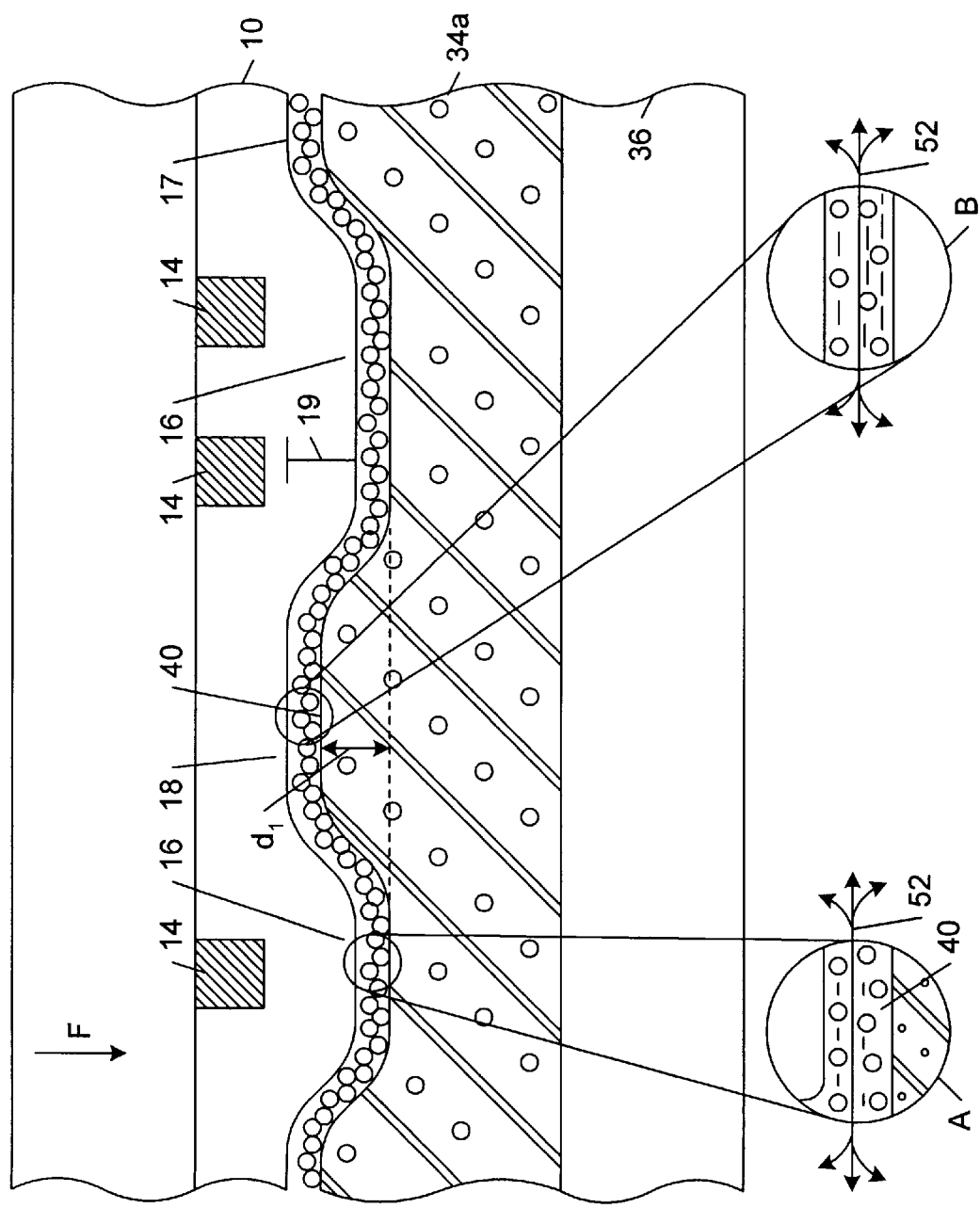
FIG. 4 is a partial cross-sectional view of an inverted semiconductor wafer being subjected to a chemical-mechanical polish using a soft polish pad.

FIG. 4 depicts wafer 10 being polished in polisher 30 using a soft polishing pad 34a. The softness or rigidity of polish pad 34a is a measure of the deflection $d_1$ that occurs in pad 34a, when pad 34a is subjected to a force F. As shown in the drawings, deflection $d_1$ can in some instances approach maximum step 19, which is defined as the elevational distance between valley 18 and peak 16. Also, shown in the drawing are two exploded views "A" and "B". The exploded views show slurry 40 in the areas proximal to peak 16 and valley 18. Pad 34a deflects an amount approaching maximum step 19 when the force F required to achieve significant etching at wafer highest spot 16 is applied. The turn-over rate 52 of slurry 40 is high in the areas adjacent to peak 16 as well as the areas adjacent to valley 18. Due to this high turn-over rate of slurry 40, the chemical component of the chemical-mechanical polish is significant in valley 18 as well as peak 16. Moreover, because the deflection $d_1$ is close to step 19, an appreciable mechanical polish occurs at valley 18. The significant mechanical and chemical polish occurring at valley 18 decreases the planarization factor of the CMP process, and results in a non-planar surface as shown in greater detail in FIG. 5.

Figure 5:
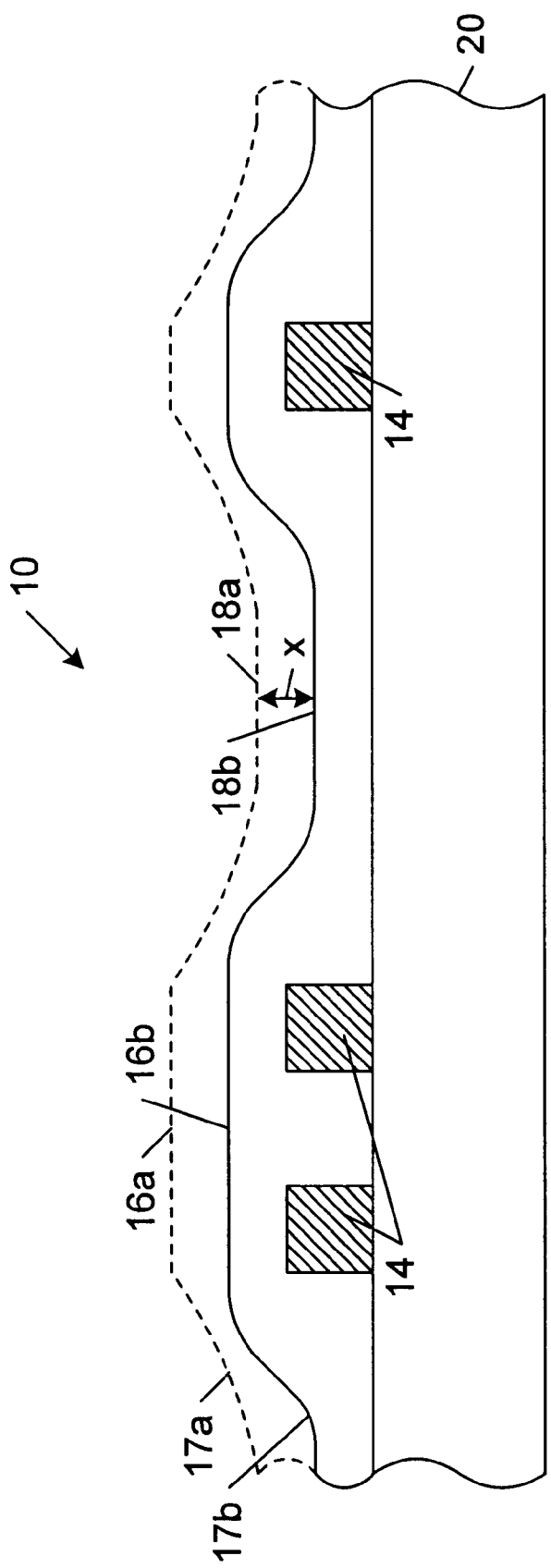
FIG. 5 is a partial cross-sectional view of a semiconductor wafer shown in FIG. 4 after completion of the chemical-mechanical polish.

FIG. 5 depicts wafer topography 17 before and after the CMP shown in FIG. 4. Line 17a represents topography 17 prior to the CMP while the solid line 17b represents the post-CMP topography. Valley 18 has been etched in an amount equal to X, representing the difference between valley 18a prior to the CMP and valley 18b after the CMP has been performed. The significant amount of material removed in valley 18 reduces the planarization factor and limits the utility of the soft pad planarization process.

Figure 6:
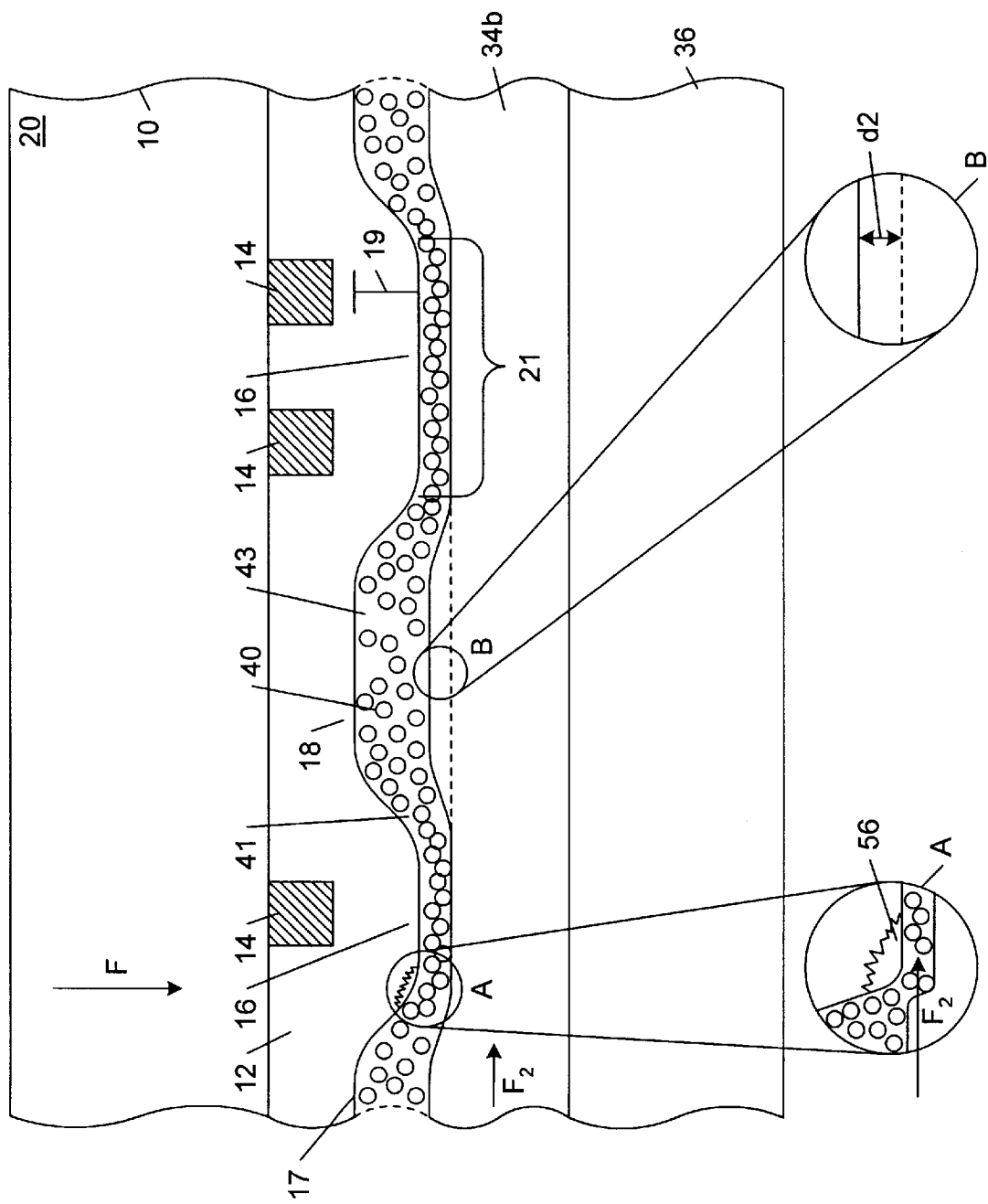
FIG. 6 shows a partial cross-sectional view of an inverted wafer being subjected to a chemical mechanical polish process, using a rigid pad.

To overcome the poor planarization factor achieved using the soft pad process, conventional single step CMP processes employ a CMP using a rigid pad 34b as shown in FIG. 6. With the rigid pad 34b, the polish pad deflection $d_2$ is negligible compared with maximum step 19 when force F is applied to wafer 10. (Force F in FIG. 6 being comparable to force F shown in FIG. 4.) Because the deflection $d_2$ is much smaller than step 19, negligible mechanical polishing occurs proximal to valleys 18. In addition, the use of rigid pad 34b results in regions of high slurry pressure 41 and regions of the low slurry pressure 43. In exploded view "A" of FIG. 6 however, a drawback of using a single step rigid pad process is shown. Because of its rigidity, rigid pad 34b is unable to conform with the leading and trailing edges 21 of peaks 16. As polish platen 36 and polish pad 34b rotate with respect to wafer 10, the inability of rigid pad 34b to conform to topography 17 results in a brief, periodic separation and contact between pad 34b and topography 17 referred to as wafer "chatter". Chatter can fragment portions of dielectric 12 at edges 21 of peaks 16, leaving a void in dielectric 12 as shown in greater detail in exploded view "A". The fragmented material can become mixed in with slurry 40 and undesirably add to the mechanical etch process. Moreover, the occurrence of dielectric voids 56 degrades the planarity of wafer topography 17 and can impact the quality of the finished product.

Figure 7:
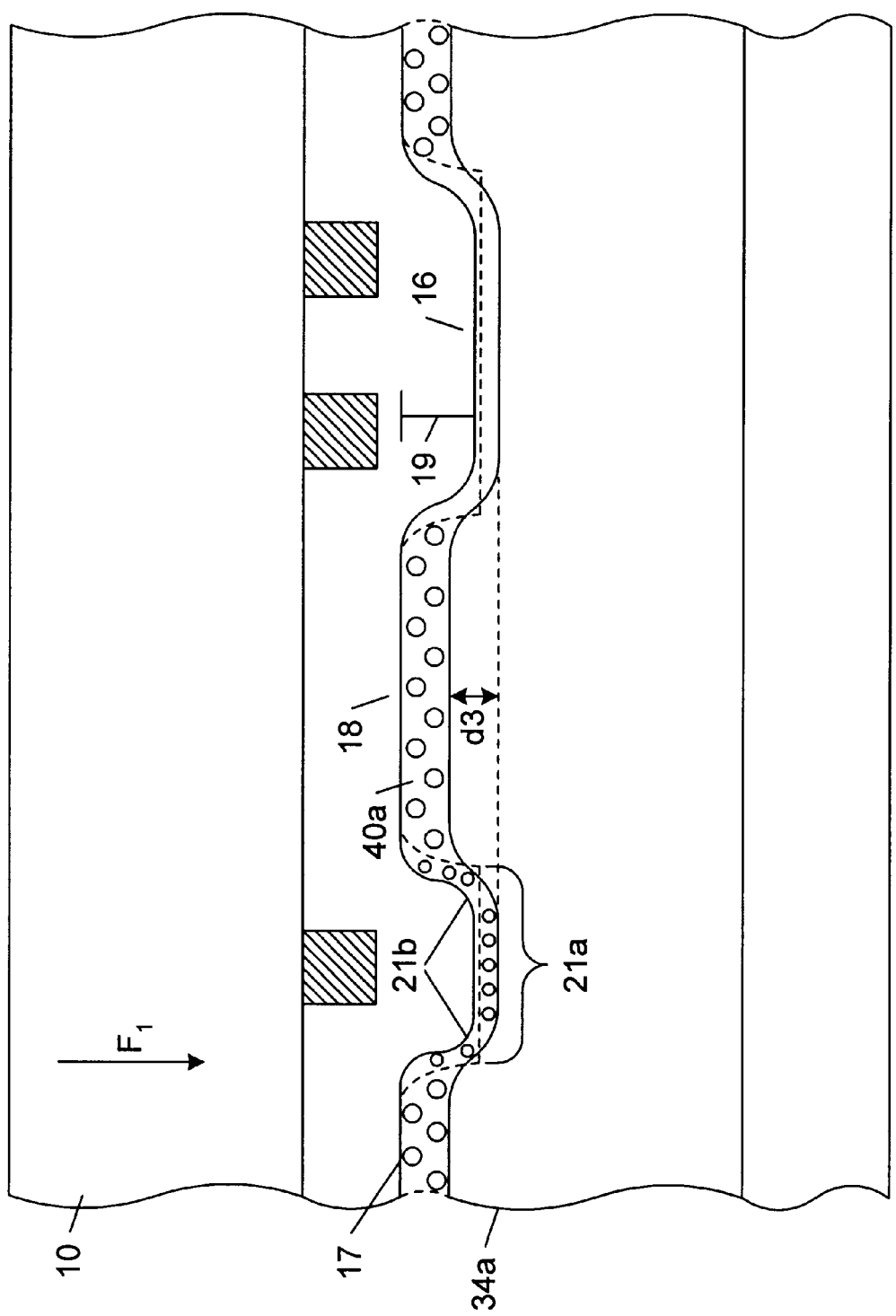
FIG. 7 shows a partial cross-sectional view of an inverted semiconductor wafer being polished with the first polish step of an improved process hereof.
Figure 8:
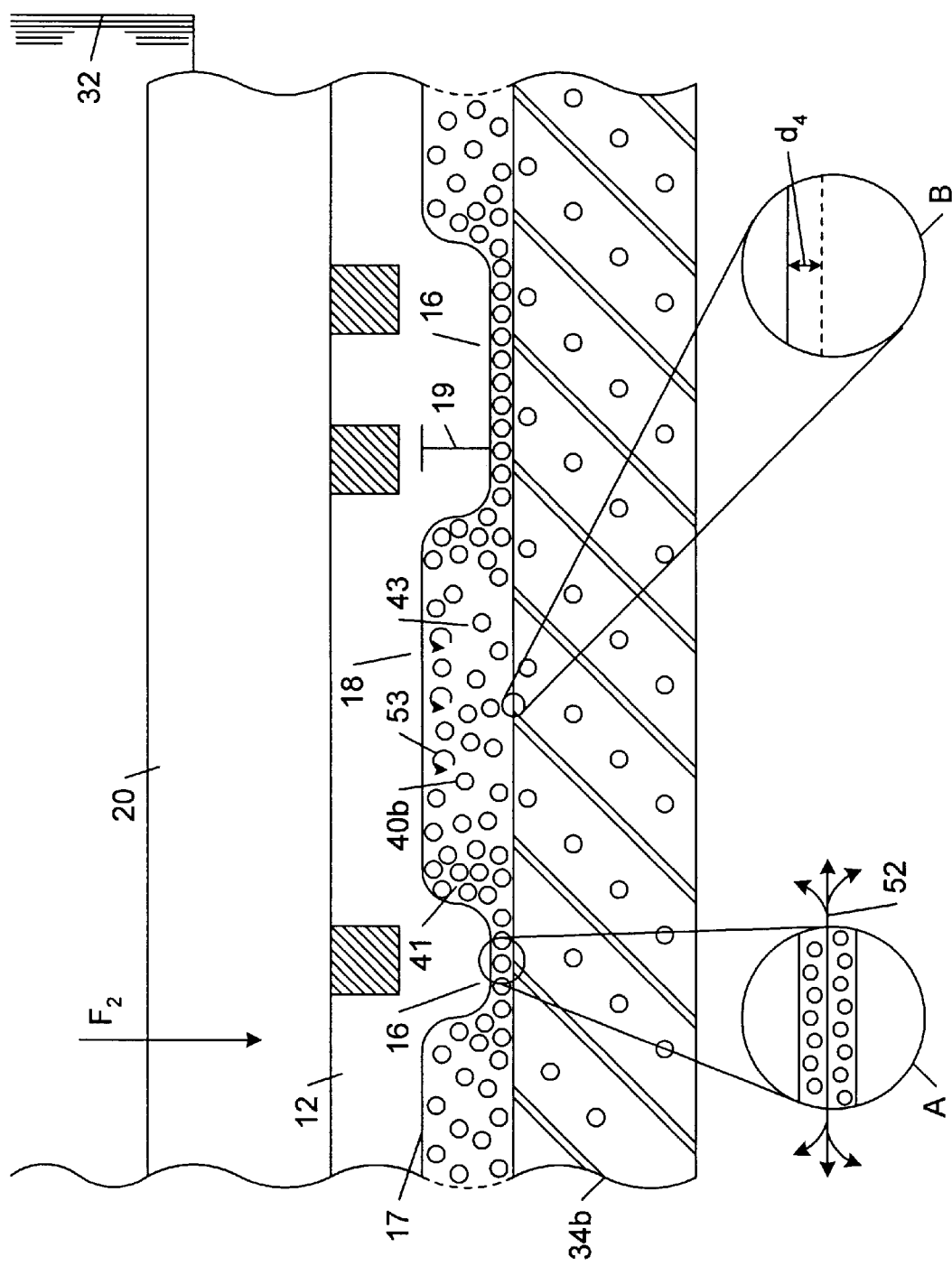
FIG. 8 shows a partial cross-sectional view of an inverted semiconductor wafer being polished according to the second step of an improved chemical mechanical process hereof.

Turning now to FIGS. 7 and 8, an improved two-step chemical-mechanical polish process hereof is shown. In FIG. 7, a first CMP is performed on wafer 10 using a soft polish pad 34a and a low force $F_1$. Soft pad 34a conforms to topography 17 tending thereby to round leading and trailing edges 21 of peaks 16 to reduce wafer chatter during a subsequent polish step performed with a rigid pad. FIG. 7 depicts leading and trailing edges 21a and 21b representing topography 17 before and after application of the low force, soft pad polish. Low force $F_1$ is designed such that the pad deflection $d_3$ is significantly less than step 19 whereby a spaced distance between pad 34a and valley 18 is maintained and the mechanical polish occurring in valleys 18 is minimized. Force $F_1$ is also substantially less than a force necessary to achieve significant mechanical etch at the peaks 16.

Turning now to FIG. 8, a second step of an improved CMP process is shown. The polish step shown in FIG. 8 employs rigid pad 34b, force $F_2$ adequate to achieve significant etch rates at the peaks 16, and high viscosity slurry 40b designed to minimize chemical polish activity in valleys 18. Rigid pad 34b deflects only a nominal amount $d_4$ under applied force $F_2$. As shown in exploded view "B" of FIG. 4, pad deflection $d_4$ is insignificant compared to maximum step 19. The nominal deflection of pad 34b results in little or no mechanical polish in valley 18.

In addition to minimizing the mechanical etch process in valley 18, the use of rigid pad 34b in combination with high viscosity slurry 40b results in a pressure gradient in slurry 40b that enhances the chemical polish at peaks 16, where the slurry pressure is high, and retards the chemical polish component in valleys 18, where the slurry pressure is low. In high pressure regions 41, the slurry flux, referred to as the slurry turn-over rate, is sufficient to sustain a chemical polish of dielectric 12. If the slurry is not constantly replenished, the acidic or basic chemicals within slurry 40b become depleted and the chemical component of the polish ceases. The slurry turnover rate varies roughly with slurry pressure and inversely with slurry viscosity. In regions of low slurry pressure 43 proximal to valley 18, the turnover rate 53 of high viscosity slurry 40b is insufficient to sustain the chemical component of the polish such that the polish rapidly becomes negligible. In contrast, the high turn-over rate 52 of slurry 40b in regions of high slurry pressure 41 proximal to peaks 16 replenishes the chemicals within slurry 40b and sustains the chemical component of the polish. In addition, the high turnover rate 52 aids in carrying away particles of dielectric 12 mechanically polished at the interface between wafer topography 17 and polishing pad 34b.

Thus, as will be appreciated by those skilled in the art, the combination of rigid pad 34b and high viscosity slurry 40b result in a polish process that is inherently self limiting in the regions proximal to valley 18. The mechanical component of the polish process is minimal in valley 18 because rigid pad 34b does not make physical contact with topography 17 proximal to valley 18. The chemical component of the polish is likewise negligible because the combination of the high viscosity of and the low pressure within slurry 40b proximal to valley 18 prevents adequate replenishment of slurry 40b thereby preventing a significant chemical polish component. Simultaneously, the opposite result is produced proximal to peaks 16. The physical contact between pad 34b and peaks 16 results in a significant mechanical polish while the high slurry pressure 41 induces adequate turnover of slurry 40b leading to a desirable chemical polish component. The planarization factor is thereby maximized by the combination of a significant polish component at peaks 16 and a minimal polish component in valley 18.

Figure 9:
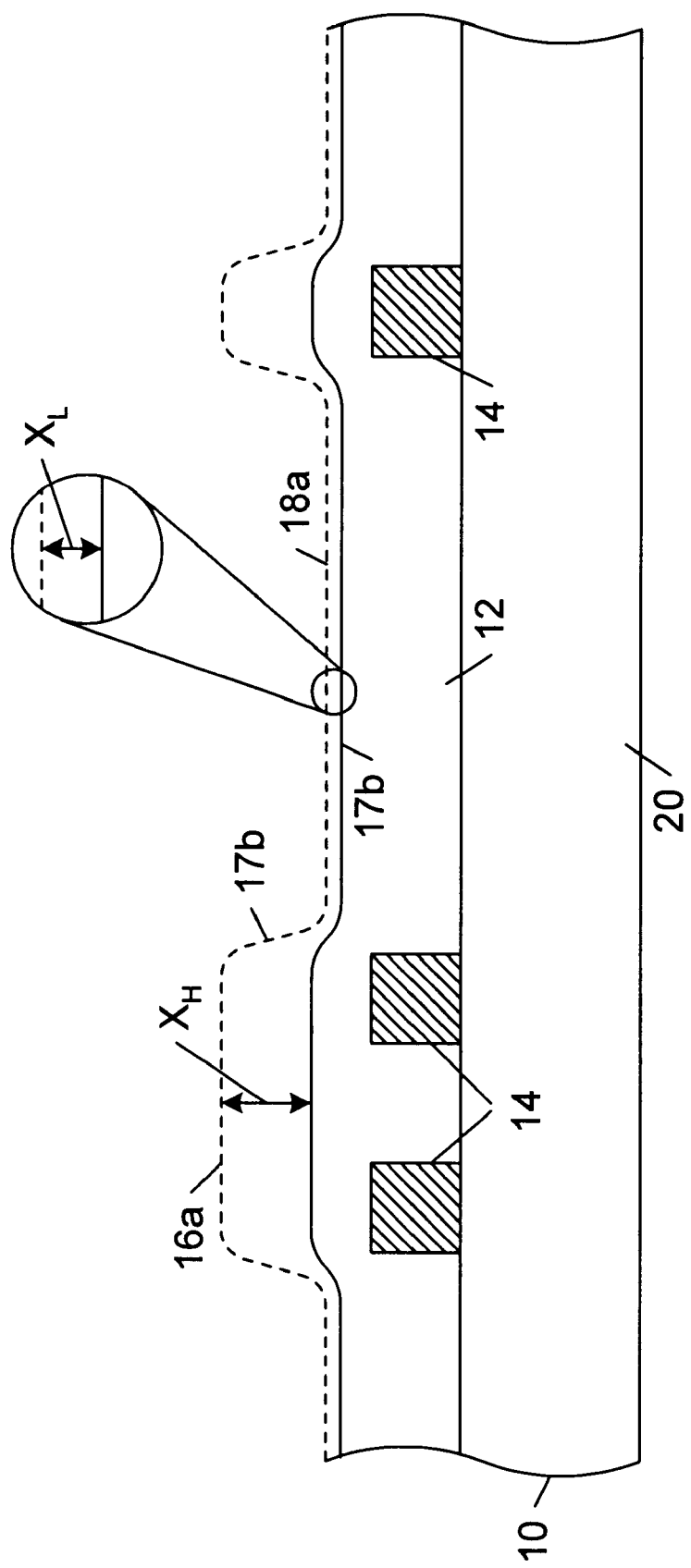
FIG. 9 is a partial cross-sectional view of a semiconductor wafer of FIG. 8 after completion of a second chemical-mechanical polish in accordance with the method hereof.

FIG. 9 shows a cross-section of wafer 10 after completion of the second polish step of FIG. 8. Wafer topography 17a represents the topography prior to the rigid pad polish of FIG. 8 and topography 17b represents the topography after completion of the rigid pad polish. Distance $X_L$ represents the amount of dielectric 12 that has been polished in valley 18 while distance $X_H$ represents the amount of dielectric 12 polished from topographical peaks 16. The improved polish process hereof results in substantially planar wafer topography 17b. The planarity of wafer topography 17b is sufficient to permit subsequent processing of wafer 10 as shown in greater detail in FIG. 10.

Figure 10:
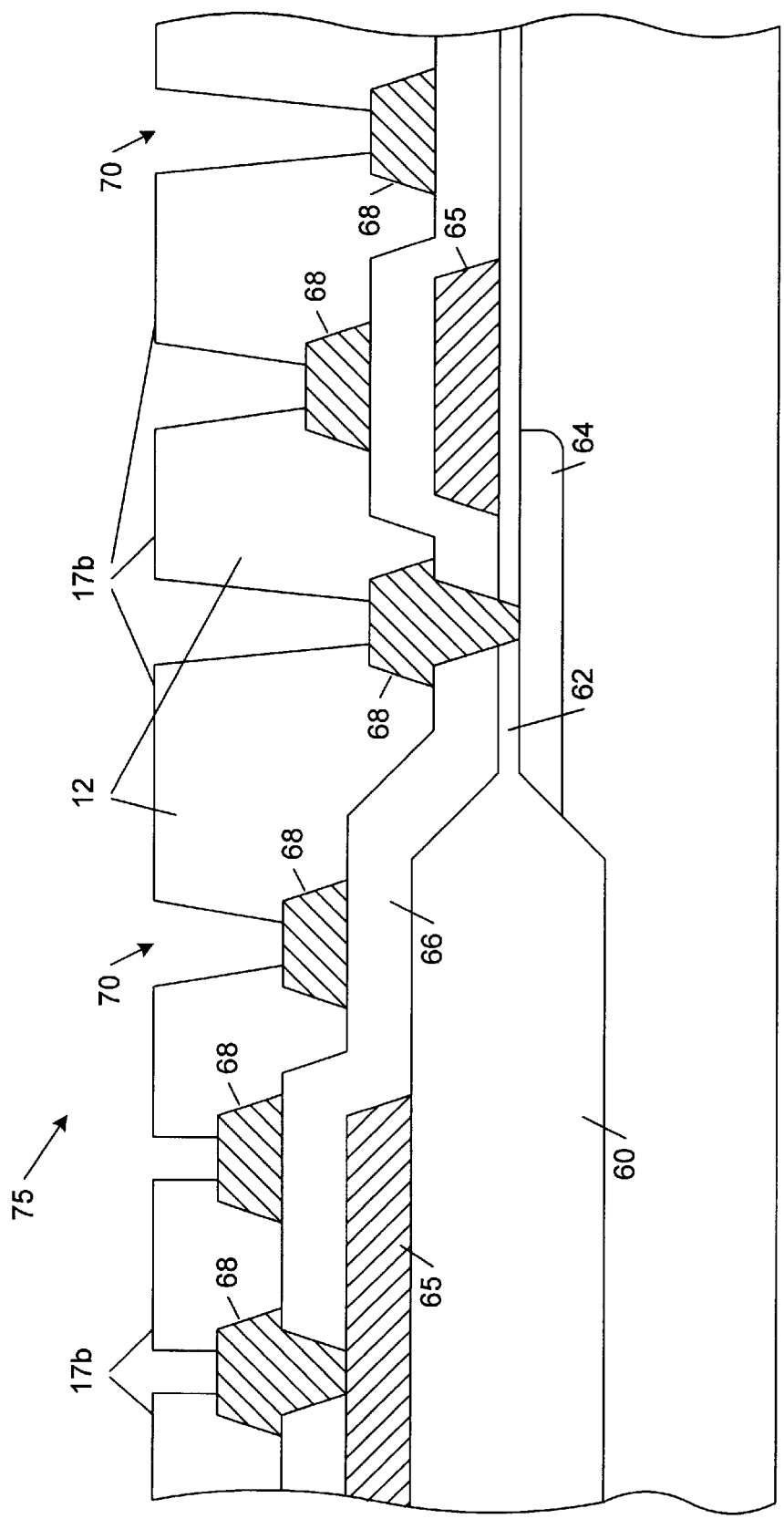
FIG. 10 shows a cross-section of a nearly complete semiconductor device having a layer of material planarized as a result of the improved CMP process hereof.

FIG. 10 shows a semiconductor device 75 having a planarized dielectric 12 formed from the two-step CMP process hereof. Device 75 is comprised of a field oxidation or local oxidation region 60, a gate oxide 62, a heavily doped source-drain region 64, a polysilicon layer 65, and interlevel dielectric 66, a first metallization level 68, a planarized dielectric 12, having a plurality of vias or contacts 70. Device 75 is shown in FIG. 10 prior to a final metallization step in a two-level metallization process, or prior to an intermediate metallization step in a three-level metallization process. Planarized dielectric 12 is shown with planarized topography 17b achieved with the improved CMP process hereof. The processing steps of underlying films (deposition, selective exposure, and removal) prior to the formation of a planarized dielectric 12 are typical of a variety of semiconductor devices and such processing is well known to those skilled in the art of semiconductor manufacturing.

It would be appreciated to those skilled in the art having the benefit of this disclosure that this invention is generally useful in providing an substantially planar interlevel dielectric between interconnect levels. Furthermore, it is also to be understood that the form of the invention shown and described is to be taken merely as presently preferred examples of how a dielectric can be planarized by combining two separate CMP steps. It is intended that the following claims be interpreted to embrace all such variations.

What is claimed is:

1. A method of planarizing an interlevel dielectric, comprising:

providing a dielectric surface comprising a valley region placed between a pair of peaks;

applying a first polish pad of a first rigidity to said dielectric surface; and after applying the first polish pad, applying a second polish pad of a second rigidity to said dielectric surface, wherein said second rigidity is greater than said first rigidity.

2. The method as recited in claim 1, wherein said first polish pad is removed prior to applying said second polish pad.

3. The method as recited in claim 1, further comprising a step of depositing a slurry between said second polish pad and said dielectric surface, wherein said slurry comprises silica particles suspended within a chemical solution having a viscosity such that the slurry flux is sufficient to sustain a chemical polish of said dielectric at said pair of peaks yet insufficient to sustain said chemical polish in said valley region.

4. The method as recited in claim 1, further comprising applying a first force to adjoin said first polish pad to said dielectric surface; and applying a second force to adjoin said second polish pad to said dielectric surface, wherein said second force is greater than said first force.

5. A method for planarizing an interlevel dielectric, comprising:

providing a dielectric surface comprising a valley region placed between a pair of peaks, said valley region and said pair of peaks having an upper surface whereby the upper surface of the valley region is recessed to an elevational level below the upper surface of said pair of peaks;

applying a first polish pad of a first rigidity and at a first force to said dielectric surface, wherein said first polish pad deforms about said pair of peaks such that said first polish pad is separated from said valley region by a first spaced distance; and removing the first polish pad from said dielectric surface and then applying a second polish pad of a second rigidity and at a second force to said dielectric surface, wherein said second rigidity is eater than said first rigidity and wherein said second polish pad deforms about said pair of peaks such that the separation between said second polish pad and said valley region is a second spaced distance greater than said first spaced distance.

6. The method as recited in claim 5, wherein said first force is less than said second force.

7. The method as recited in claim 5, further comprising a step of depositing a slurry between said second polish pad and said dielectric surface, wherein said slurry comprises silica particles suspended within a chemical solution having a viscosity such that the slurry flux is sufficient to sustain a chemical polish of said dielectric at said pair of peaks yet insufficient to sustain said chemical polish in said valley region.

\* \* \* \* \*

UNITED STATES PATENT AND TRADEMARK OFFICE

CERTIFICATE OF CORRECTION

PATENT NO. : 5,968,843

DATED : October 19, 1999

INVENTOR(S) : Dawson et al.

It is certified that error appears in the above-identified patent and that said Letters Patent is hereby corrected as shown below:

In the Claims:

Claim 5, col. 10, line 9, after the phrase "said second rigidity is" please delete "eater" and substitute therefor --greater--.

Signed and Sealed this

Eighteenth Day of April, 2000

*Attest:*

Q. TODD DICKINSON

*Attesting Officer*    *Director of Patents and Trademarks*